United States Patent [19]

Anderson

[11] Patent Number: 4,861,978

[45] Date of Patent: Aug. 29, 1989

[54] AUTOMATIC GAIN SETTING CIRCUIT

[76] Inventor: Thor W. Anderson, 9720 Forest Creek Dr., Bozeman, Mont. 59715

[21] Appl. No.: 125,183

[22] Filed: Nov. 25, 1987

[51] Int. Cl.$^4$ .................... H01J 40/14; G01R 15/08; G01R 1/30

[52] U.S. Cl. ................ 250/214 A; 250/227; 324/115; 324/123 R

[58] Field of Search ............... 324/115, 123 R, 123 C, 324/99 R; 250/214 A, 214 R, 227, 214 AG

[56] References Cited

U.S. PATENT DOCUMENTS

| | | | |
|---|---|---|---|
| 3,159,787 | 12/1964 | Sexton et al. | 324/99 R |
| 4,682,022 | 7/1987 | Hoult et al. | 250/214 A |

Primary Examiner—Ernest F. Karlsen
Attorney, Agent, or Firm—Richard C. Conover

[57] ABSTRACT

An automatic gain setting circuit for automatically adjusting the gain of an amplifier which drives an analog meter. The gain of this amplifier is adjusted automatically with the push of a button switch so that the meter will read mid-range for the signal input to the amplifier. In this circuit, the operational amplifier is connected between an input signal and the analog meter readout. This operational amplifier utilizes a feedback circuit having a variable resistance which changes the gain of the amplifier as the resistance is changed. The resistance in this feedback circuit is changed by an electrical comparison circuit which compares the output signal from the amplifier with a reference voltage upon the push of a button switch. The reference voltage is preset to cause the meter to read mid-range. Once the button switch is pushed, the comparison circuit provides an output control signal which is directed to the feedback circuit of the operational amplifier. This control signal, in effect, varies the resistance in the amplifier feedback circuit so as to adjust the gain of this amplifier. The signal output of this amplifier is automatically increased or decreased until the magnitude of the signal output corresponds to the preset reference voltage which in turn corresponds to a mid-range reading of the meter. The gain of the operational amplifier is then maintained until the button switch is pushed again.

4 Claims, 2 Drawing Sheets

AUTOMATIC GAIN SETTING CIRCUIT

BACKGROUND OF THE INVENTION

This invention relates to an electrical circuit for automatically adjusting the gain of an amplifier used to drive an analog meter so that the meter automatically reads at mid-range. A preferred use of the present circuit is with equipment for use in the fiber optic industry and in particular with equipment for aligning the ends of optical fibers when the ends of the fibers are to be joined as by splicing.

The fiber optic industry has been rapidly developing in recent years to accommodate such new technologies as high speed communication circuits. Concomitant with this rapid development has been an increasing need to have the ability to properly splice optical fibers when a break occurs in a fiber for one reason or another.

When two ends of optical fibers are to be spliced together, it is necessary to align the ends of the fibers before splicing to maximize light transmission across the splice junction. A conventional method of aligning optical fibers prior to splicing is to inject light into one of the optical fibers, towards the end to be spliced and then to measure the light transmitted across the junction with a detector positioned to detect the light received in the second fiber. In conventional apparatus, the light detected in the second fiber is converted into an electrical signal which is amplified and directed to an analog meter. With this apparatus the fiber ends are moved relative to one another until the signal, which is visually displayed by the meter, is at a maximum. When this occurs the fibers are optimally positioned for splicing.

Unless the person doing the splicing has access to the two distant ends of the two fibers being spliced, there is a problem of getting light into and out of the fiber which is necessary for the detection apparatus to operate. In principle, by bending a fiber, light energy can be injected into the core of an optical fiber. Conversely, by bending a fiber, light energy within the core will escape. It is this property of optical fibers that makes possible "local injection - detection instruments", as they are called. These instruments aid in splicing optical fibers by allowing an operator to manipulate the ends of the fibers being spliced while measuring the amount of light being transmitted through the splice rather than working through others who make measurements remote from the break.

With conventional apparatus, there are problems in scaling the meter used to display the electrical signal representative of the light transmitted across the splicing junction. These difficulties arise because the fibers are constructed of different materials and use different cladding. There are also different splicing methods used. As a result, it has been found that the ratio of the light injected into the fiber and the signal detected on the other side of the junction may vary from 20,000 to 1. With present day instruments it is not uncommon to have offscale readings on the meter because of the significant variations in the light energy transmitted across the junction when the optical fibers are misaligned or different types of fibers are being spliced.

Techniques in existence for coping with this wide range of signal strengths include manual gain control circuits and automatic ranging circuits which divide the total dynamic range into discrete increments in order to obtain signals with enough resolution to properly align the connection. With these circuits, the gain of the measuring circuit needs to be continually adjusted in order for the meter to remain near the center of the scale.

SUMMARY OF INVENTION

In accordance with the present invention, an electrical circuit is provided which is designed to automatically accommodate different optical fibers during splicing. The circuit uses an adjustable gain amplifier which drives an analog meter. The gain of this amplifier is adjusted automatically with the push of a button switch so that the meter will read mid-range when a particular fiber is being spliced. In this circuit an operational amplifier is connected between the detector and the analog meter readout. This operational amplifier utilizes a feedback circuit having a variable resistance which changes the gain of the amplifier as the resistance is changed.

The resistance in this feedback circuit is changed by an electrical comparison circuit which compares the output signal from the amplifier with a reference voltage upon the push of a button switch. The reference voltage is preset to cause the meter to read mid-range and is preset at the time of construction of the instrument. Once the button switch is pushed, the comparison circuit provides an output control signal which is directed to a junction field effect transistor located in the feedback circuit of the operational amplifier. This control signal, in effect, varies the resistance in the amplifier feedback circuit so as to adjust the gain of this amplifier. The signal output of this amplifier is automatically increased or decreased until the magnitude of the signal output corresponds to the preset reference voltage which in turn corresponds to a mid-range reading of the meter. The gain of the operational amplifier is then maintained until the button switch is pushed again.

Thus, with the present device, the meter can be adjusted to read mid-range at the push of a button and can accomplish this result for a wide variety of fibers, claddings and methods of splicing.

DESCRIPTION OF THE DRAWINGS

In order that the invention may be clearly understood and readily carried into effect, a preferred embodiment will now be described, by way of example only, with reference to the accompanying drawings wherein.

DESCRIPTION OF A PREFERRED EMBODIMENT

Figure 1:
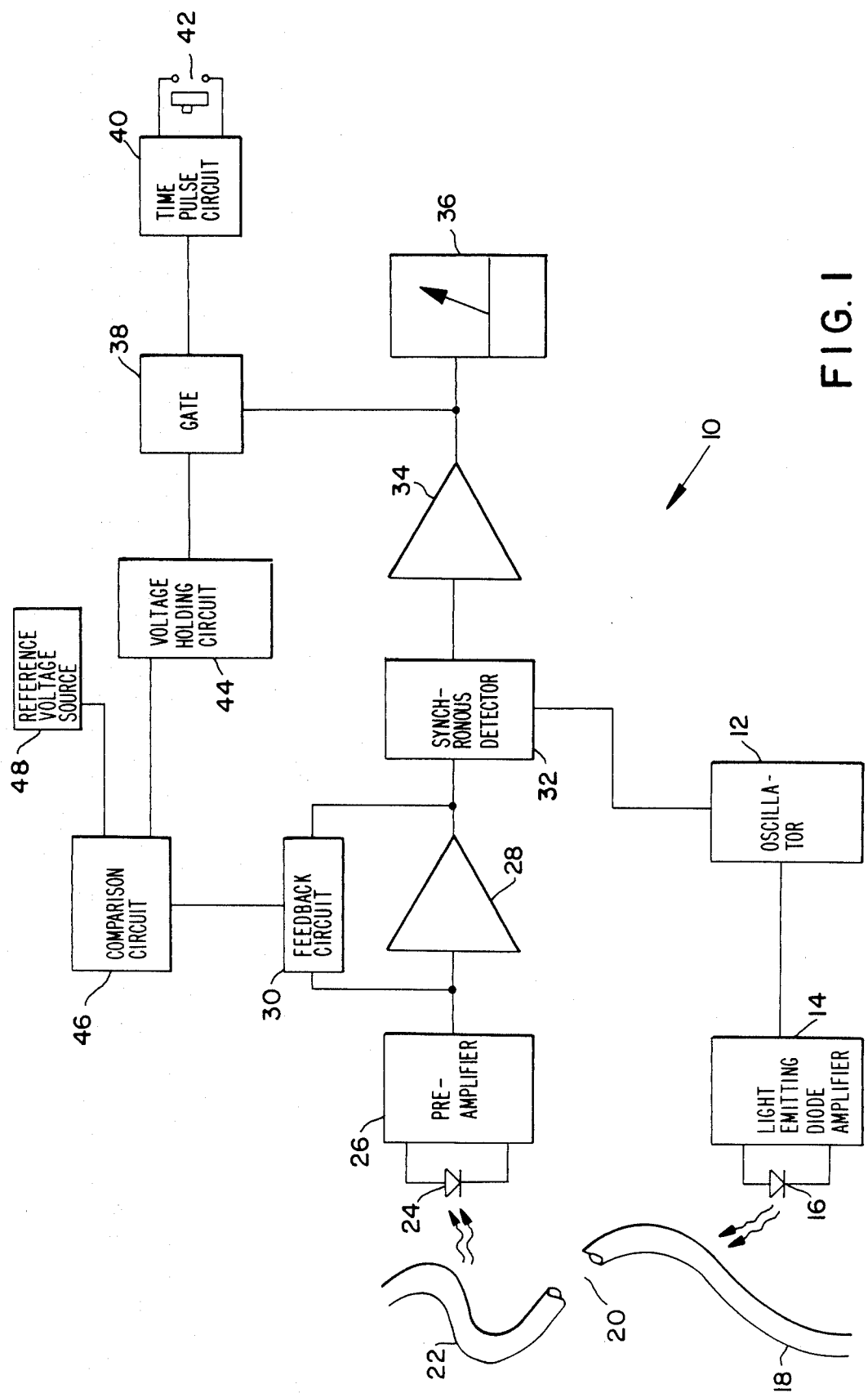
FIG. 1 is a schematic block diagram of a local injection-detection circuit including the automatic gain setting circuit according to the present invention.

A local injection-detection instrument 10 is shown in FIG. 1 for optimally positioning the ends of fibers to be spliced. In this instrument an oscillator 12 provides an output which is directed to an amplifier 14 for driving a light emitting diode 16.

The light emitting diode 16 produces light waves that are injected into an optical fiber 18 which has been bent in accordance with conventional light injection techniques. The injected light passes across a junction 20 and into a second optical fiber 22. This second optical fiber is bent again according to conventional technology so that the light passes through the wall of the optical fiber, whereupon the emerging light is detected by a photosensitive diode 24. This diode 24 causes a current to flow which is proportional to the optical power transmitted to the second fiber 22 across the junction 20. The current developed in the photosensitive diode 24 is directed to a pre-amplifier 26 the output of which is directed to an adjustable gain amplifier 28. The gain of amplifier 28 is adjusted by a feedback circuit 30 connected between an output and an input of the adjustable gain amplifier 28. The signal amplified by the adjustable gain amplifier 28 is then directed to a synchronous detector circuit 32.

Oscillator 12 is also connected through a delay circuit (not shown) to the synchronous detector circuit 32. Synchronous detector circuit 32 is thus able to filter out those components of the electrical signal detected by diode 24 which are not in phase with and of the same frequency as the signal output of oscillator 12. The output of the synchronous detector circuit 32 is a direct current (DC) voltage which is proportional to the signal detected by the photosensitive diode 24. This DC signal is connected to a meter amplifier 34 which drives an analog meter 36. Thus, the meter displays a signal which is proportional to the amplitude of the light detected by photosensitive diode 24 which signal is in phase with and of the same frequency as the signal produced by oscillator source 12.

With this apparatus, the fibers at the junction 20 are mechanically aligned and repositioned with respect to one another to obtain a maximum reading on the meter 36. When this occurs, the fibers are optimally aligned so that they can be spliced in place.

With conventional circuitry, the feedback circuit 30 comprises an adjustable resistance which is manually adjusted to provide a mid-range reading of the detected current on the meter 36. By changing the feedback resistance, the gain of the amplifier 28 is modified to either increase or decrease the amplitude of the signal output of amplifier 28 which in turn is displayed with meter 36.

With the present invention, the gain of the amplifier 28 is automatically adjusted whenever a button switch is pushed so that the meter 36 reads at mid-range.

In accordance with the present invention, the output of the meter amplifier 34 is directed to a transistor gate 38. If the gate 38 is in a conducting state, this signal will pass through gate 38. If not, this signal does not pass. A gating signal for causing the gate 38 to become conducting is formed by a time-pulse circuit 40 which is activated by a push button switch 42. When the button switch 42 is depressed, a gating pulse is transmitted to gate 38. The time constant of this gating pulse is selected to be of sufficient duration to allow the feedback circuit 30 to stabilize at a mid-scale reading at meter 36 as will be described subsequently.

The signal passed by gate 38 is directed to a voltage holding circuit 44. This voltage holding circuit holds the voltage received from gate 38 until it is changed by a signal of different voltage being passed through gate 38.

The output of the voltage holding circuit is directed to a comparison circuit 46. This comparison circuit compares a reference voltage received from a reference voltage source 48 with the voltage received from the gate 38. The reference voltage is preset to be the voltage required to have the meter 36 read mid-range.

If comparison circuit 46 detects a difference in magnitude of the two voltages, the comparison circuit provides an output control signal which is directed to the feedback circuit 30 to change the gain of amplifier 28. As will be described, this control signal is used to adjust the gain of the amplifier 28 so that the output of meter amplifier 34 equals the reference voltage.

As noted above, the time constant of the timepulse circuit 40 is selected to have a duration sufficiently long to permit the comparison circuit 46 to compare the voltage output of the meter amplifier 34 with the reference voltage 48 and adjust the resistance in feedback circuit 30 to permit the output of the meter 34 to equal the reference voltage. The adjusted voltage is then held constant by voltage holding circuit 44 until the button switch 42 is again depressed. Thus, the gain of the amplifier 28 is adjusted automatically by the push of button switch 42 to provide an output at the meter amplifier circuit 34 which equals the reference voltage and causes a mid-range reading of the meter 36.

Whenever the detected voltage causes the meter 36 to read off scale, the button switch 42 can be depressed again causing the comparison circuit 46 and feedback circuit 30 to again adjust the gain of amplifier 28 until such time as the meter 36 again reads mid-range. This is all accomplished by simply depressing the button switch 42.

Figure 2:
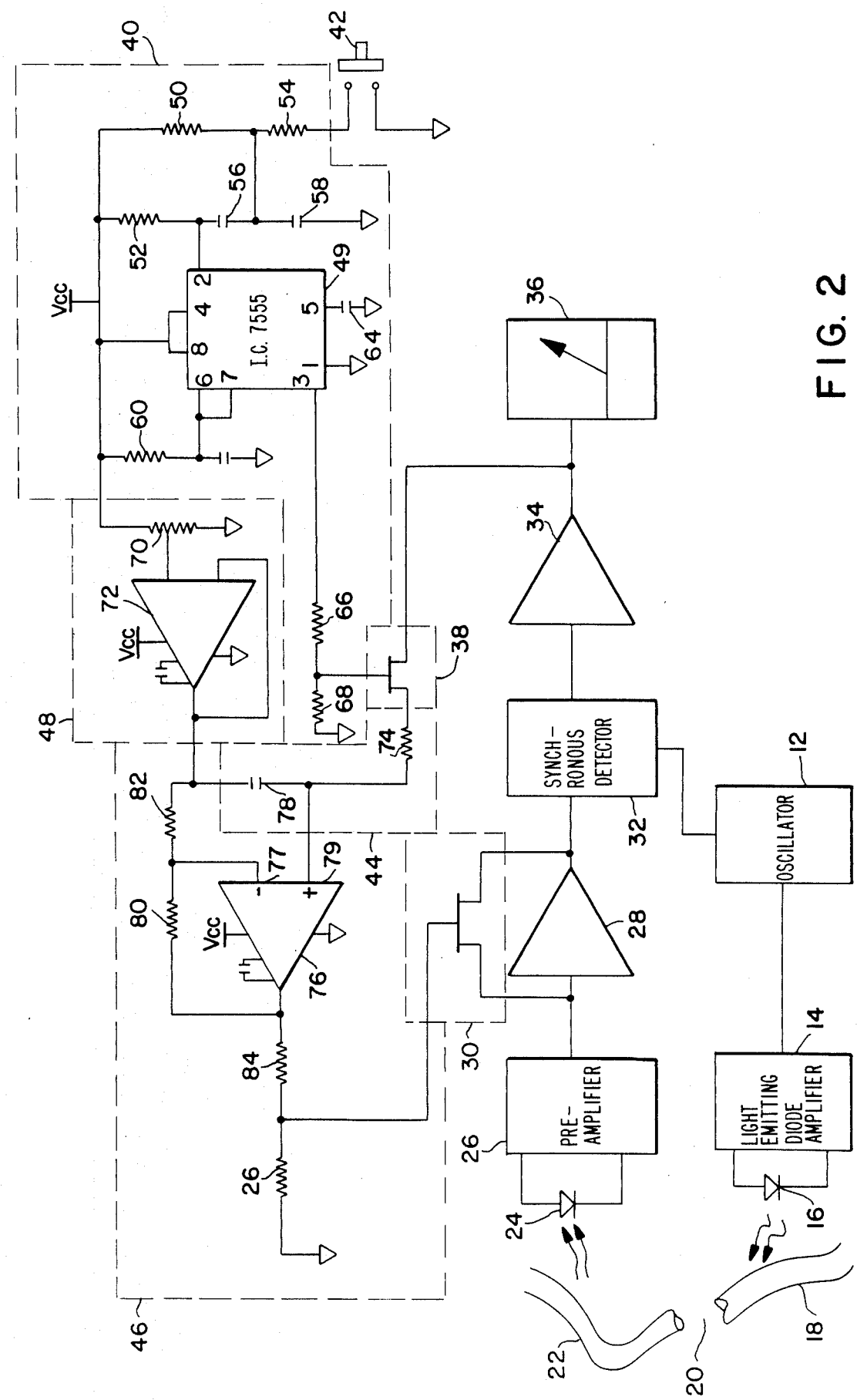
FIG. 2 is a schematic block diagram of a local injection-detection circuit and a detail schematic electrical circuit of the automatic gain setting circuit as shown in FIG. 1.

The automatic gain setting circuit according to the present invention is shown in detail in FIG. 2. In this circuit, the output of the meter amplifier 34 is directed to a transistor gate 38. The gating signal causing the gate 38 to become conducting is a pulse of preselected duration created by the time-pulse circuit 40. The time-pulse circuit 40 includes an integrated circuit 49 which in a preferred embodiment is a Model 7555 integrated circuit manufactured by Intersil. The button switch 42 activates the integrated circuit 49 through the network formed by resistors 50, 52 and 54 and capacitors 56 and 58. Terminal "5" of integrated circuit 49 is connected to ground through capacitor 64. Terminals "4" and "8" of integrated circuit 49 are connected to the positive supply voltage shown as "$V_{cc}$" in the drawings. The integrated circuit 49 produces a single output pulse at terminal "3" whose time-width is determined by resistor 60 and capacitor 62 connected to terminals "6" and "7" as shown. The output pulse at terminal "3" of the integrated circuit 49 is fed through the network of resistors 66 and 68 to the gate 38 which is switched "on" for the duration of the time-width of the pulse.

With the gate 38 switch "on", the voltage appearing at the output of meter amplifier 34 is transmitted through the transistor gate 38, the resistor 74 to the comparison circuit 46 and also to one side of capacitor 78. The other side of capacitor 78 is connected to the output terminal of amplifier 72. The comparison circuit 46 includes an amplifier 76 having an inverting input terminal 77 and a non-inverting input terminal 79. The signal transmitted by transistor gate 38 is connected to terminal 79.

The reference voltage source 48 is connected through resistor 82 to terminal 77 of the comparison amplifier 76.

The reference voltage source 48 includes a potentiometer 70 which is connected between the positive supply voltage "$V_{cc}$" and ground. The wiper of the potentiometer 70 is connected to an amplifier 72. The voltage at the output of amplifier 72 is a DC voltage corresponding to the reference voltage that would produce a mid-scale reading of the meter 36. In a preferred embodiment, the amplifier 72 is a CA3130 amplifier manufactured by RCA.

The comparison amplifier 76, whose gain is controlled by the ratio of resistors 80 and 82, compares the voltage appearing at its non-inverting input terminal 79 with the voltage appearing at its inverting input terminal 77. The output of the comparison amplifier 76 is a voltage control signal which is applied to the feedback circuit 30 for controlling the gain of amplifier 28.

The output of the amplifier 76 is directed through the resistor network 84 and 86 to the feedback circuit 30 connected to the amplifier 28. In a preferred embodiment, the feedback circuit 30 comprises a junction field effect transistor whose drain to source resistance is varied by the signal received from the comparison amplifier 76. The voltage output of the comparison amplifier 76 changes the gate voltage of the field effect transistor, changing the drain to source resistance, which in turn increases or decreases the gain of the adjustable gain amplifier 28 in accordance with the control signal received. As a result, the voltage at the output of meter amplifier 34 is automatically adjusted to correspond to the reference voltage. Thus, during the automatic gain setting time interval, the detected signal from diode 24 is automatically adjusted in amplitude to cause a mid-scale reading on meter 36.

The time required for this automatic gain adjustment to occur is much shorter than the time the gate 38 is maintained in a conductive state. Thus, the gain of the adjustable gain amplifier 28 is stabilized before gate 38 returns to its normally non-conductive state.

Further, a voltage holding circuit 44 is provided to maintain the gain of amplifier 28 until button 42 is again depressed. In a preferred embodiment, the voltage holding circuit 44 comprises the capacitor 78 and resistor 74 as shown in FIG. 2. When the transistor gate 38 returns to a non-conductive state, the voltage stored on the capacitor 78 remains at the non-inverting input terminal 79 of amplifier 76. Thus, the output signal from comparison amplifier 76 to the feedback circuit 30 is held constant. In operation, the operator makes a preliminary alignment of the two fibers in preparation for splicing. The oscillator 12 is activated to produce a light signal in the light emitting diode 16. The detected signal is then displayed on the meter 36. If the meter 36 is not reading mid-range, the button switch 42 is depressed causing the automatic gain setting circuit to be activated which causes the meter to read mid-range. The fibers are then manually adjusted to provide a maximum reading on the meter 36. If the reading on the meter 36 goes off scale, the button switch 42 can again be depressed momentarily causing the automatic gain setting circuit to adjust the readout to mid-range.

While the fundamental novel features of the invention have been shown and described, it should be understood that various substitutions, modifications and variations may be made by those skilled in the art without departing from the spirit or scope of the invention. Accordingly, all such modifications and variations are included in the scope of the invention as defined by the following claims:

I claim:

1. A circuit arrangement for driving an analog meter in accordance with an input detected signal comprising:
    (a) an operational amplifier having an input terminal and an output terminal;
    (b) an adjustable feedback circuit means connected to the operational amplifier for varying the gain of the operational amplifier in response to a received control signal;
    (c) the detected signal being applied to the input terminal of the operational amplifier;
    (d) an output terminal of the operational amplifier being electrically connected to the analog meter;
    (e) a comparison circuit means having first and second input terminals for comparing the relative magnitude of voltages applied to the first and second input terminals and for providing an output signal having a polarity and magnitude corresponding to the relative difference;
    (f) the output terminal of the operational amplifier being additionally connected to the first input terminal of the comparison circuit;
    (g) a reference voltage source connected to the second input terminal of the comparison circuit;
    (h) the output of the comparison circuit being the control signal, which signal is directed to the adjustable feedback circuit to adjust this feedback circuit to adjust the gain of the operational amplifier in accordance with the polarity and magnitude of the control electrical signal;
    (i) switch means connected to the comparison circuit which when activated operatively permits the comparison circuit to change the gain of the operational amplifier, the switch means further including means for forming a timing pulse having a preselected duration; and
    (j) gate means being connected between the output terminal of the operational amplifier and the first terminal of the comparison circuit means for connecting the output of the operational amplifier only during the duration of the timing pulse.

2. The circuit according to claim 1 wherein the adjustable feedback circuit means includes a junction field effect transistor means for varying the effective resistance between the input and output terminals of the operational amplifier dependant upon the control signal received from the comparison circuit.

3. The circuit according to claim 1 further including means for maintaining the gain of the operational amplifier constant until the switch is again activated.

4. An apparatus for optimally aligning a first and second optical fiber for splicing, the circuit comprising:
    (a) a light source for injecting light into a first fiber across a junction between the two fibers and into the second fiber;
    (b) a detector for detecting the light being transmitted in the second fiber and providing a detected electrical signal responsive to the light detected;
    (c) an operational amplifier having an input terminal and an output terminal;
    (d) an adjustable feedback circuit means connected to the operational amplifier for changing the gain of the operational amplifier in accordance with a received control electrical signal;
    (e) the detected signal being applied to the input terminal of the operational amplifier;
    (f) the output terminal of the operational amplifier being electrically connected to an analog meter for displaying the magnitude of the detected signal;
    (g) a comparison circuit means having a first and second input terminals for comparing the relative magnitude of voltages applied to the first and second input terminals and for providing an output signal having a polarity and magnitude corresponding to the relative difference;

(h) the output terminal of the operational amplifier being additionally connected to the first input terminal of the comparison circuit;
(i) a reference voltage source connected to the second input terminal of the comparison circuit, the reference voltage being selected to be of a magnitude to cause the meter to read approximately mid-range;
(j) the output of the comparison circuit being the control electrical signal/which signal is directed to the adjustable feedback circuit of the operational amplifier to adjust the gain of the operational amplifier circuit in accordance with the polarity and magnitude of the control electrical signal;
(k) switch means connected to the comparison circuit which when activated, operatively permits the comparison circuit to change the gain of the operational amplifier; whereby, the gain of the operational amplifier is automatically adjusted to amplify the detected signal to produce an approximate mid-range reading of the detected electrical signal on the meter.

* * * * *